(12) United States Patent
Kim et al.

(10) Patent No.: US 11,951,507 B2
(45) Date of Patent: Apr. 9, 2024

(54) MASK

(71) Applicant: SAMSUNG DISPLAY CO., LTD., Yongin-si (KR)

(72) Inventors: Hwi Kim, Suwon-si (KR); Jeongkuk Kim, Suwon-si (KR); Da-Hee Jeong, Seoul (KR); Seungyong Song, Suwon-si (KR); Areum Lee, Suwon-si (KR); Hye Yong Chu, Hwaseong-si (KR); Kyu Hwan Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/175,273

(22) Filed: Feb. 27, 2023

(65) Prior Publication Data

US 2023/0201868 A1    Jun. 29, 2023

Related U.S. Application Data

(62) Division of application No. 17/318,298, filed on May 12, 2021, now Pat. No. 11,590,529.

(30) Foreign Application Priority Data

Aug. 26, 2020   (KR) .......................... 10-2020-0107990

(51) Int. Cl.
*B05C 21/00*     (2006.01)
*B23K 26/362*   (2014.01)

(52) U.S. Cl.
CPC .......... *B05C 21/005* (2013.01); *B23K 26/362* (2013.01)

(58) Field of Classification Search
CPC ........................... B05C 21/005; B23K 26/362
See application file for complete search history.

(56) References Cited

U.S. PATENT DOCUMENTS

| | | | |
|---|---|---|---|
| 8,881,676 B2 | 11/2014 | Hong | |
| 9,656,291 B2 | 5/2017 | Lee et al. | |
| 2011/0031486 A1 | 2/2011 | Shigemura et al. | |
| 2011/0185965 A1* | 8/2011 | Park | C23C 14/042 118/504 |
| 2011/0185966 A1* | 8/2011 | Lee | C23C 14/042 118/504 |
| 2014/0291306 A1 | 10/2014 | Lee et al. | |
| 2019/0100834 A1 | 4/2019 | Sakio et al. | |
| 2020/0248297 A1 | 8/2020 | Aoki et al. | |

(Continued)

FOREIGN PATENT DOCUMENTS

| | | |
|---|---|---|
| EP | 1291117 A1 | 3/2003 |
| JP | 2019-31720 A | 2/2019 |
| KR | 10-2015-0029414 A | 3/2015 |

(Continued)

OTHER PUBLICATIONS

Machine translation of Japan Patent No. 2019031720-A, Jul. 2022 (Year: 2022).

*Primary Examiner* — Geoffrey S Evans
(74) *Attorney, Agent, or Firm* — Lewis Roca Rothgerber Christie LLP

(57) ABSTRACT

Provided is a mask manufacturing method which includes preparing a mask sheet and a frame, stretching the mask sheet, and fixing the stretched mask sheet to the frame, and forming cell openings in the mask sheet fixed to the frame.

3 Claims, 12 Drawing Sheets

(56) References Cited

U.S. PATENT DOCUMENTS

2021/0230734 A1    7/2021  Luo et al.
2022/0002859 A1    1/2022  Luo et al.

FOREIGN PATENT DOCUMENTS

| | | | | |
|---|---|---|---|---|
| KR | 10-2017-0084471 A | 7/2017 | | |
| KR | 10-1820020 B1 | 1/2018 | | |
| KR | 10-2020-0041240 A | 4/2020 | | |
| WO | WO-2018099055 A1 * | 6/2018 | ........... | C23C 14/042 |

* cited by examiner

MASK

CROSS-REFERENCE TO RELATED APPLICATIONS

This application is a divisional of U.S. patent application Ser. No. 17/318,298, filed May 12, 2021, which claims priority to and the benefit of Korean Patent Application No. 10-2020-0107990, filed Aug. 26, 2020, the entire content of both of which is incorporated herein by reference.

BACKGROUND

1. Field

The present disclosure herein relates to a mask having improved reliability, and to a method for manufacturing the mask.

2. Description of the Related Art

Display panels include a plurality of pixels. Each of the pixels includes a driving element, such as a transistor, and a display element, such as an organic light emitting diode. The display element may be formed by stacking an electrode and a light emitting pattern on a substrate.

The light emitting pattern is patterned by using a mask in which through-portions are defined so that the light emitting pattern is formed in a given area. The light emitting pattern may be formed in areas exposed by the through-portions. The shape of the light emitting pattern may be controlled according to the shape of the through-portions.

SUMMARY

The present disclosure provides a mask having improved reliability for a deposition process, and a mask manufacturing method.

Some embodiments of the present disclosure improve machining precision for cell openings, and reduce a dead space by laser-machining the cell openings after stretching and welding a mask.

A mask and a mask manufacturing method according to some embodiments of the present disclosure improve machining precision for cell openings by reducing a tensile force of a stretched mask sheet through preliminary machining prior to laser beam machining of the cell openings.

Some embodiments of the present disclosure provide a mask manufacturing method including preparing a mask sheet and a frame, stretching the mask sheet, and fixing the stretched mask sheet to the frame, and forming cell openings in the mask sheet fixed to the frame.

The forming of the cell openings may include forming preliminary cell openings in the mask sheet fixed to the frame, and forming the cell openings to respectively correspond to the preliminary cell openings, respectively.

A size of each of the preliminary cell openings may be about 25% to about 90% of a size of each of the cell openings.

A shape of the preliminary cell openings may be different from a shape of the cell openings.

The preparing of the mask sheet may include forming preliminary cell openings in the mask sheet, wherein the forming of the cell openings includes forming the cell openings to respectively correspond to the preliminary cell openings.

All of the preliminary cell openings may be removed during the forming of the cell openings.

The forming of the cell openings may include emitting a laser beam onto the mask sheet fixed to the frame.

Inner surfaces of the mask sheet, which define the cell openings, may have a tapered shape.

The mask manufacturing method may further include locating an electrostatic chuck on the mask sheet fixed to the frame between the fixing of the mask sheet to the frame and the forming of the cell openings.

The forming of the cell openings may include forming preliminary cell openings prior to forming the cell openings, wherein the cell openings respectively correspond to the preliminary cell openings, and wherein a size of each of the cell openings is greater than a size of each of the preliminary cell openings.

The mask manufacturing method may further include removing the electrostatic chuck from the mask sheet after the forming of the cell openings.

In some embodiments of the present disclosure, a mask manufacturing method includes preparing a mask sheet and a frame, stretching the mask sheet, and fixing the stretched mask sheet to the frame, forming slit openings in the mask sheet fixed to the frame, and forming cell openings, each of which being between respective ones of the slit openings.

A number of the slit openings may be greater than a number of the cell openings.

A size of each of the slit openings may be less than a size of each of the cell openings.

The forming of the cell openings may include forming preliminary cell openings, each of which is located between respective ones of the slit openings, and forming the cell openings to respectively correspond to the preliminary cell openings.

A size of each of the preliminary cell openings may be less than a size of each of the cell openings, wherein a shape of the preliminary cell openings is different from a shape of the cell openings.

The mask manufacturing method may further include locating an electrostatic chuck on the mask sheet after the fixing of the mask sheet to the frame.

In some embodiments of the present disclosure, a mask includes a frame, and a mask sheet that is located on the frame, and in which cell openings, and slit openings respectively between corresponding ones of the cell openings, are defined, wherein a width of each of the slit openings is less than a width of each of the cell openings.

The mask may further include shielding members that are respectively located on the slit openings to shield the slit openings.

A material of the shielding members may be the same as a material of the mask sheet.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
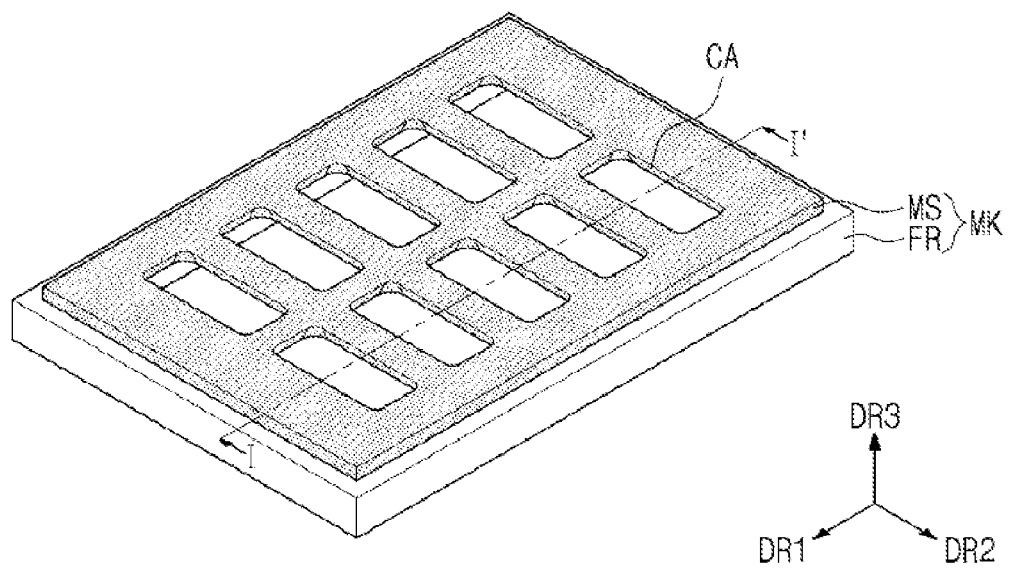
FIG. 1 is a perspective view showing a mask according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view showing a mask according to some embodiments of the present disclosure.

Referring to FIG. 1, a mask MK may be used in a process for depositing a deposition material. In some embodiments of the present disclosure, the mask MK may include a frame FR and a mask sheet MS.

The top surface of each component is parallel to a plane defined by a first direction DR1 and a second direction DR2. The thickness direction of each component is indicated by a third direction DR3. The upper side (or upper portion) and the lower side (or lower portion) of each component are distinguished from each other by the third direction DR3. However, directions indicated as the first to third directions DR1, DR2, and DR3 have relative concepts and thus may be changed to other directions.

The frame FR may have a ring shape when viewed in a plan view. That is, an opening area may be provided in an area including the center of the frame FR. The opening area may be a hole that passes from the top surface of the frame FR to the bottom surface of the frame FR.

FIG. 1 illustrates a rectangular ring shape as an example of the shape of the frame FR (see also FIG. 4A), but the shape of the frame FR is not limited thereto. For example, the frame FR may have various shapes, such as a circular ring and a polygonal ring. FIG. 1 schematically illustrates that the frame FR is located below the mask sheet MS to support the mask sheet MS, but the embodiments of the present disclosure are not limited thereto. The frame FR may be located below the mask sheet MS to support the mask sheet MS and may allow the mask sheet MS to extend in the first direction DR1 and the second direction DR2.

The mask MS according to some embodiments may include a plurality of cell openings CA that are arranged in the first direction DR1 and the second direction DR2. In some embodiments, the cell openings CA are illustrated such that there are two rows or columns spaced apart from each other in the second direction DR2, each row including five cell openings spaced apart from each other in the first direction DR1, but this is merely illustrated as an example. The mask sheet MS may include more cell openings CA. Also, the cell openings CA may be arranged in only one of the first direction DR1 or the second direction DR2, but are not limited to any one embodiment.

The mask sheet MS according to some embodiments may have a plate shape extending in the first direction DR1 and the second direction DR2. The mask sheet MS may include the plurality of cell openings CA arranged in the first direction DR1 and the second direction DR2, and may have an integrated plate shape so that the cell openings CA are connected to each other. The mask sheet MS includes the plurality of cell openings CA, and an extension area for surrounding each of the cell openings CA, with the cell openings CA being connected to each other by the extension area. Thus, the mask sheet MS may have the integrated plate shape. The mask sheet MS according to some embodiments may not have a stick shape extending in any one of the first direction DR1 or the second direction DR2, but may have a plate shape extending in both the first direction DR1 and the second direction DR2. However, the embodiments of the present disclosure are not limited thereto, and a mask sheet MS according to other embodiments of the present disclosure may have a stick shape in which each of multiple mask sheets extends in any one direction of the first direction DR1 or the second direction DR2, and in which the mask sheets are spaced in the other direction.

In some embodiments, the mask sheet MS and the frame FR may include the same material. For example, the mask sheet MS and the frame FR may include an alloy of iron (Fe) and nickel (Ni). In some embodiments, the mask sheet MS and the frame FR may include nickel and iron, and may further include cobalt (Co). In this case, each of the mask sheet MS and the frame FR may include about 5% of cobalt (Co).

Figure 2:
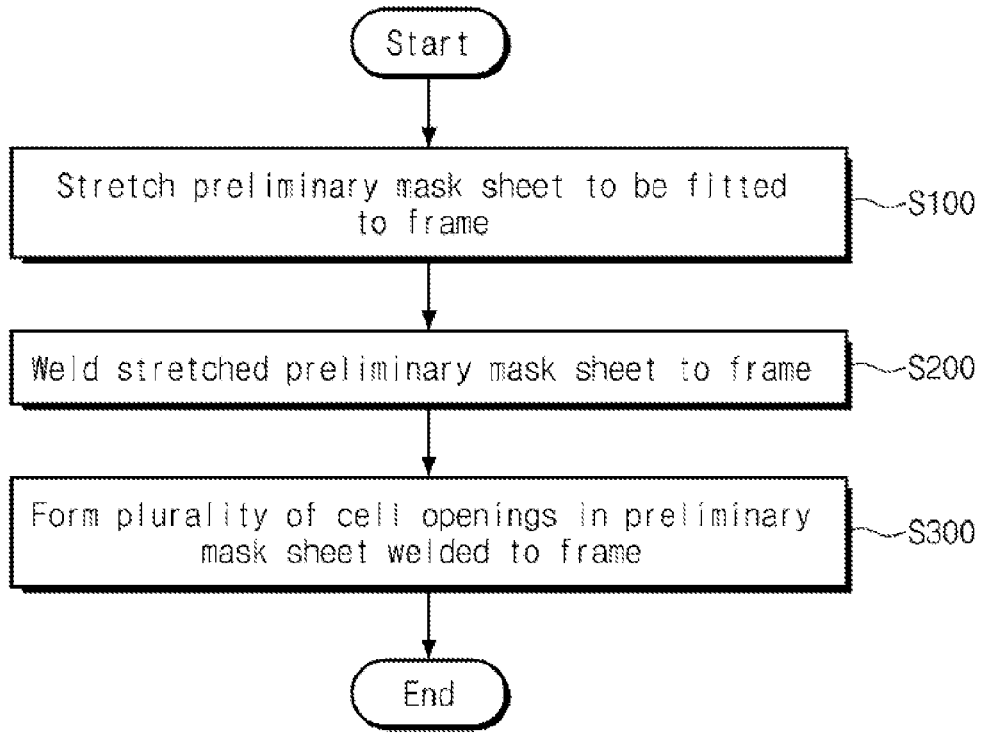
FIG. 2 is a flowchart showing a mask manufacturing method according to some embodiments of the present disclosure.
Figure 3:
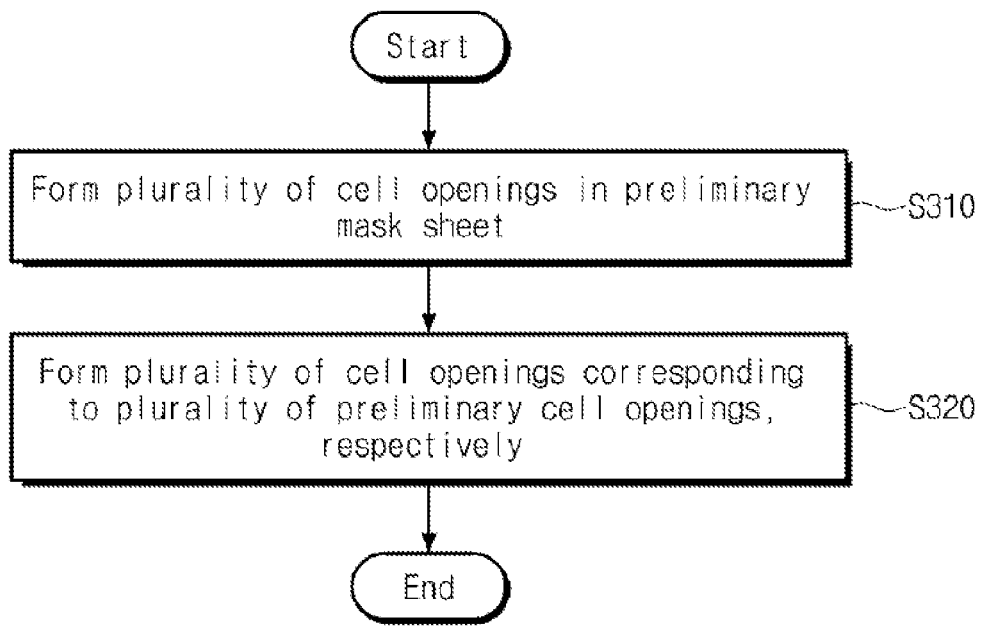
FIG. 3 is a flowchart showing a mask manufacturing method according to some embodiments of the present disclosure.

FIG. 2 is a flowchart showing a mask manufacturing method according to some embodiments of the present disclosure. FIG. 3 is a flowchart showing a mask manufacturing method according to some embodiments of the present disclosure. FIGS. 4A to 4E are views showing a mask manufacturing method according to some embodiments of the present disclosure, and illustrate the mask manufacturing method according to the flowcharts of FIGS. 2 and 3.

Referring to FIG. 2, the mask manufacturing method may include preparing a frame and a preliminary mask sheet. The preliminary mask sheet may have a plate body shape for forming the mask sheet. The preliminary mask sheet represents a mask sheet in which cell openings are not formed yet. For convenience of description, the preliminary mask sheet is used as a term to be distinguished from the mask sheet including the cell openings.

The mask manufacturing method according to some embodiments of the present disclosure may include stretching the preliminary mask sheet to be fitted to the frame (S100). The preliminary mask sheet may be stretched to a size of the frame so that the preliminary mask sheet is fixed to the frame.

The mask manufacturing method according to some embodiments of the present disclosure may include fixing the preliminary mask sheet to the frame (S200). The preliminary mask sheet may be fixed, in a stretched state, to the frame through a welding process.

The mask manufacturing method according to some embodiments of the present disclosure may include forming a plurality of cell openings in the preliminary mask sheet, which is welded and fixed to the frame (S300). The mask sheet may be provided by forming the plurality of cell openings in the preliminary mask sheet.

Referring to FIG. 3, the forming (S300, see FIG. 2) of the plurality of cell openings may include forming a plurality of preliminary cell openings in the preliminary mask sheet (S310), and forming a plurality of cell openings that respectively correspond to the plurality of formed preliminary cell openings (S320). Here, the plurality of preliminary cell openings may be temporary openings which, prior to forming the cell openings, are formed in advance at positions where the cell openings are to be formed.

In other embodiments, the preliminary cell openings may be formed during the preparing of the preliminary mask sheet. That is, the preliminary cell openings may be formed before the preliminary mask sheet is stretched and fixed to the frame. Because the preliminary mask sheet is not required to be precisely manufactured, the preliminary cell openings do not need to be formed after the preliminary mask sheet is stretched and fixed to the frame.

Referring to FIGS. 4A to 4E, the mask manufacturing method according to some embodiments of FIGS. 2 and 3 will be described in detail. FIGS. 4A to 4E are views sequentially showing the mask manufacturing method of some embodiments of the present disclosure.

Figure 4A:
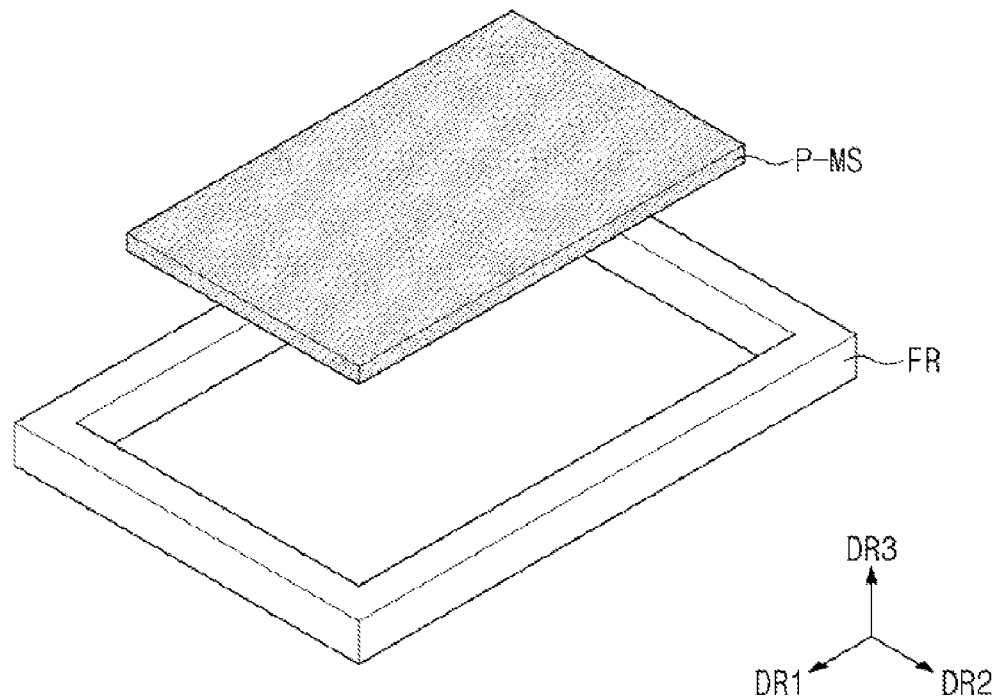
FIGS. 4A to 4E are views showing a mask manufacturing method according to some embodiments of the present disclosure.

FIG. 4A shows preparing a preliminary mask sheet P-MS and a frame FR. In FIG. 4A, the preliminary mask sheet P-MS and the frame FR are prepared. The sizes of the preliminary mask sheet P-MS in a first direction DR1 and a second direction DR2 are respectively less than the sizes of the frame FR in the first direction DR1 and the second direction DR2. The thicknesses, which are the lengths of the preliminary mask sheet P-MS and the frame FR in a third direction DR3, are not limited to those illustrated in the drawing, but the thickness of the preliminary mask sheet P-MS may be the same as the thickness of the frame FR, for example.

Figure 4B:
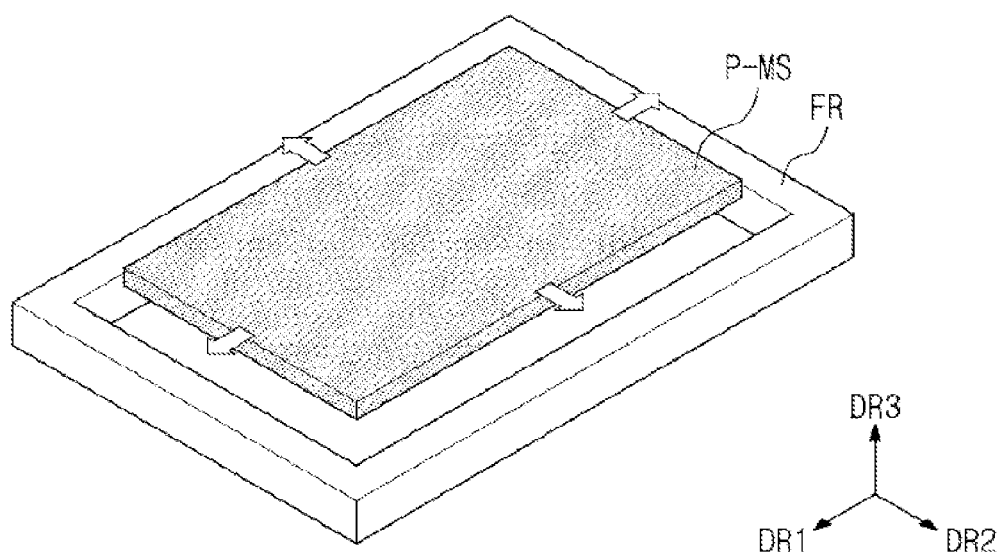

FIG. 4B shows stretching a preliminary mask sheet P-MS. In FIG. 4B, the preliminary mask sheet P-MS may be stretched to be a size of the frame FR in both the first direction DR1 and the second direction DR2 so that the preliminary mask sheet P-MS is fixed to the frame FR.

Figure 4C:
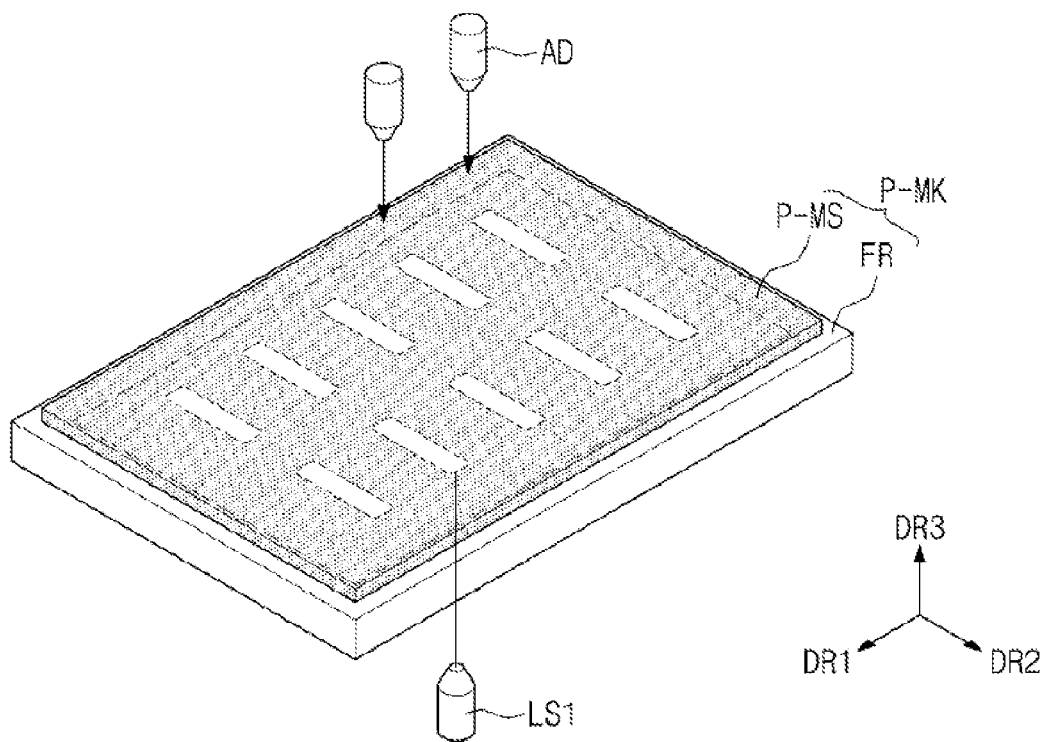
Figure 4D:
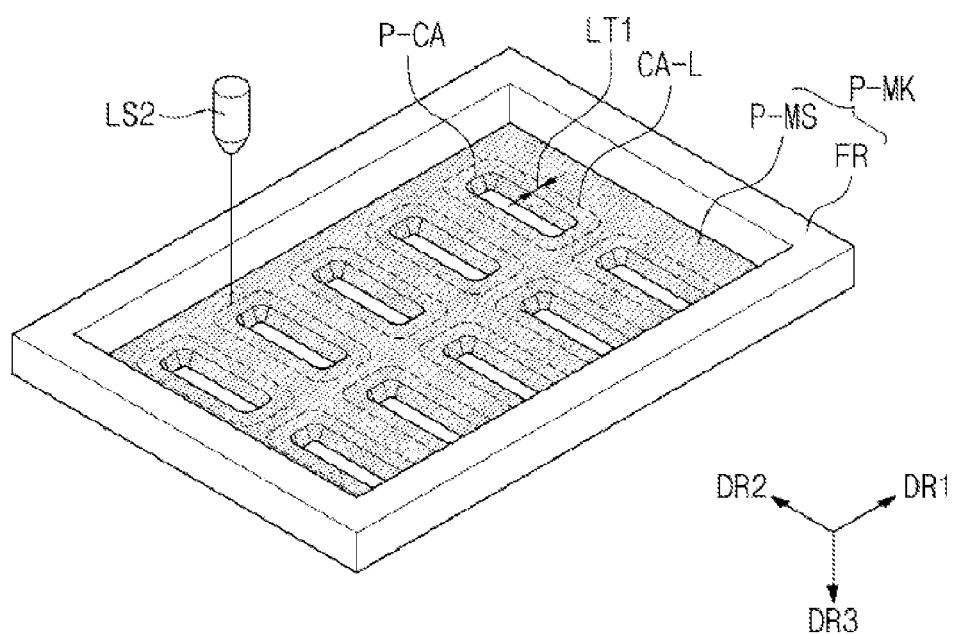

FIG. 4C shows fixing the preliminary mask sheet P-MS to the frame FR and forming preliminary cell openings. FIG. 4D shows forming cell openings that respectively correspond to the preliminary cell openings.

In FIGS. 4C and 4D, the stretched preliminary mask sheet P-MS may be placed on the frame FR and welded to the frame FR by a welding member AD. A preliminary mask sheet P-MS, which is fixed to the frame FR by the welding, is in a state in which cell openings CA for a deposition process are not formed yet. In a subsequent process, when a mask sheet MS is made by forming the cell openings CA in the preliminary mask sheet P-MS, a mask MK may be formed together with the frame FR.

In some embodiments, a laser beam LS1 may be emitted onto the preliminary mask sheet P-MS to form preliminary cell openings P-CA. When the preliminary cell openings P-CA are formed, cell openings CA corresponding to the preliminary cell openings P-CA may be formed. The cell openings CA may be formed by emitting a laser beam LS2. The embodiments illustrate only a case in which the formation of the preliminary cell openings P-CA and the cell openings CA are formed by emitting the laser beams LS1 and LS2, but the preliminary cell openings P-CA and the cell openings CA may be formed by another process, such as an etching process. In some embodiments, the laser beams LS1 and LS2 may be emitted from a side that is closer to the frame FR than to the preliminary mask sheet P-MS in the third direction DR3.

The size of each of the preliminary cell openings P-CA is less than the size of each of the cell openings CA. For example, the size of each of the preliminary cell openings P-CA may be about 25% to about 90% of the size of each of the cell openings CA. Each of the preliminary cell openings P-CA may have various sizes within a range that does not affect machining of the cell openings CA. The inner diameter of the preliminary cell opening P-CA may be less than the inner diameter of the corresponding cell opening CA by about 100 μm to about 1 mm. That is, a difference LT1 in inner diameters between the preliminary cell openings P-CA and the cell openings CA may be about 100 μm to about 1 mm.

All of the preliminary cell openings P-CA may be removed during the forming of the cell openings CA. That is, the preliminary cell openings P-CA may be temporary openings that are temporarily provided to form the cell openings CA at positions where the cell openings CA are to be formed. The preliminary cell openings P-CA may reduce the tensile force being applied to the preliminary mask sheet P-MS. That is, as the preliminary cell openings P-CA are formed prior to forming the cell openings CA, the tensile force being applied to the preliminary mask sheet P-MS is reduced during the forming of the cell openings CA, and accordingly, the degree of deformation occurring during the machining of the cell openings CA may be reduced.

In some embodiments, the shape of the preliminary cell openings P-CA may be different from the shape of the cell openings CA. For example, the cell openings CA may have a rectangular shape, and the preliminary cell openings P-CA may have a circular shape. Also, a plurality of preliminary cell openings P-CA may be provided to correspond to one cell opening CA. For example, two or more preliminary cell openings P-CA may be formed at each of positions where the cell openings CA are respectively formed.

Figure 4E:
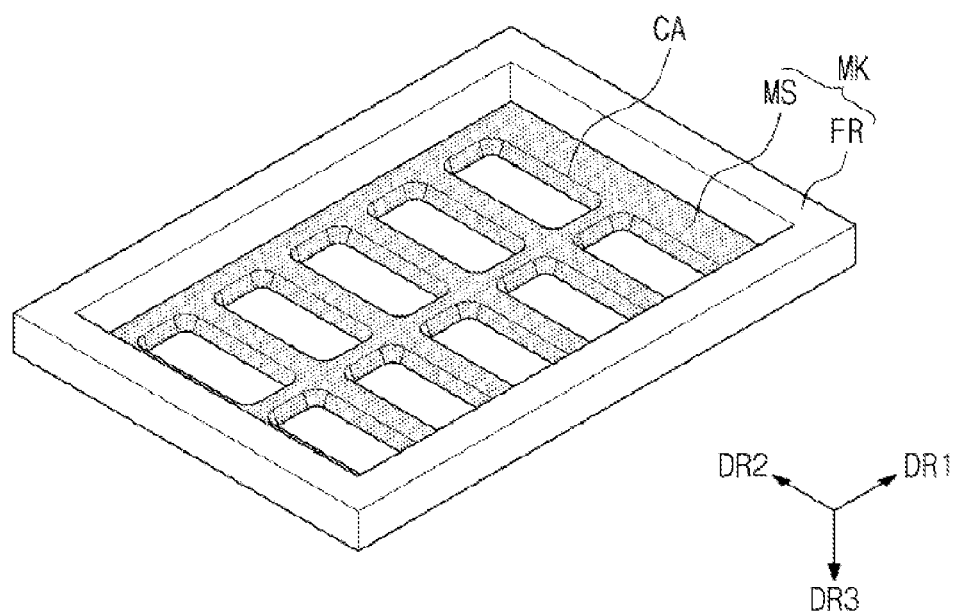

In FIG. 4E, when the cell openings CA, which respectively correspond to the preliminary cell openings P-CA, are formed while the preliminary mask sheet P-MS is fixed to the frame FR, the mask sheet MS is provided and may constitute the mask MK together with the frame FR.

Figure 5:
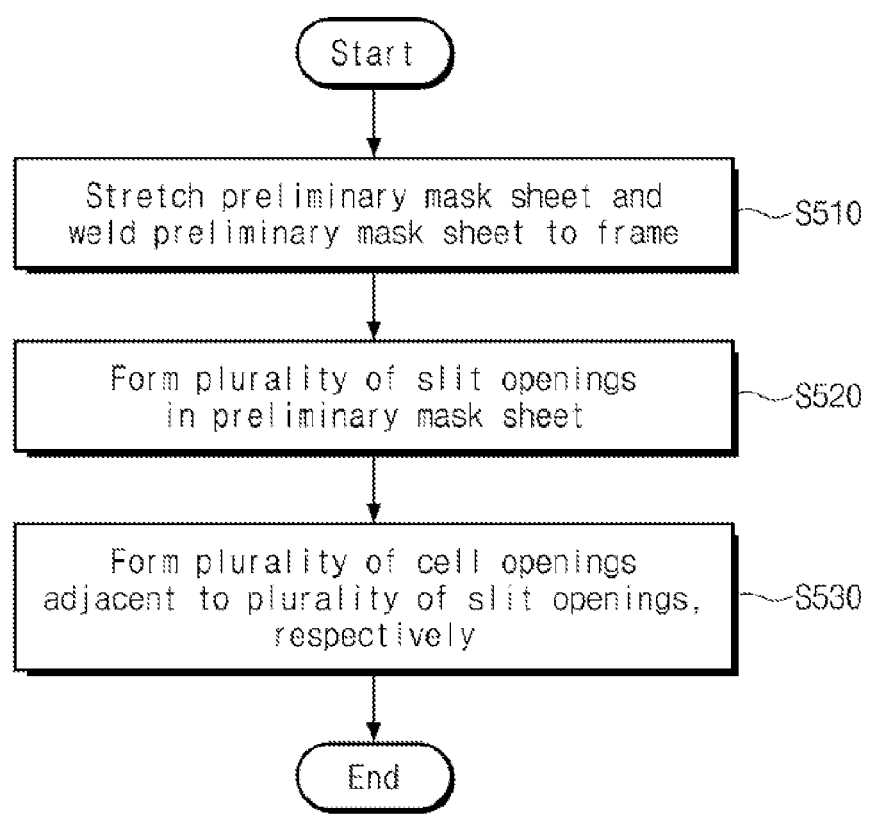
FIG. 5 is a flowchart showing a mask manufacturing method according to some embodiments of the present disclosure.
Figure 6A:
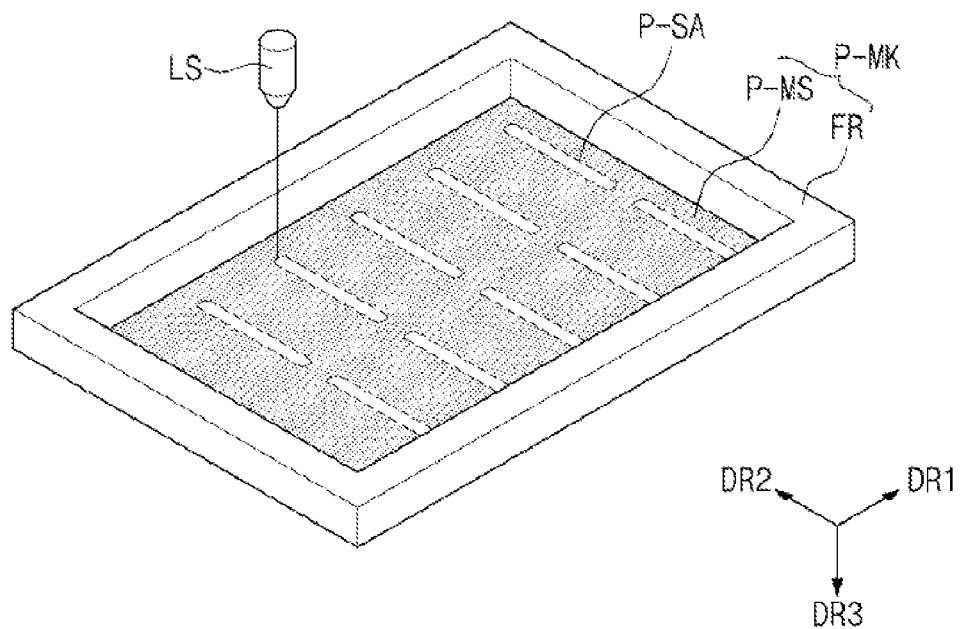
FIGS. 6A to 6C are views showing a mask manufacturing method according to some embodiments of the present disclosure.
Figure 6B:
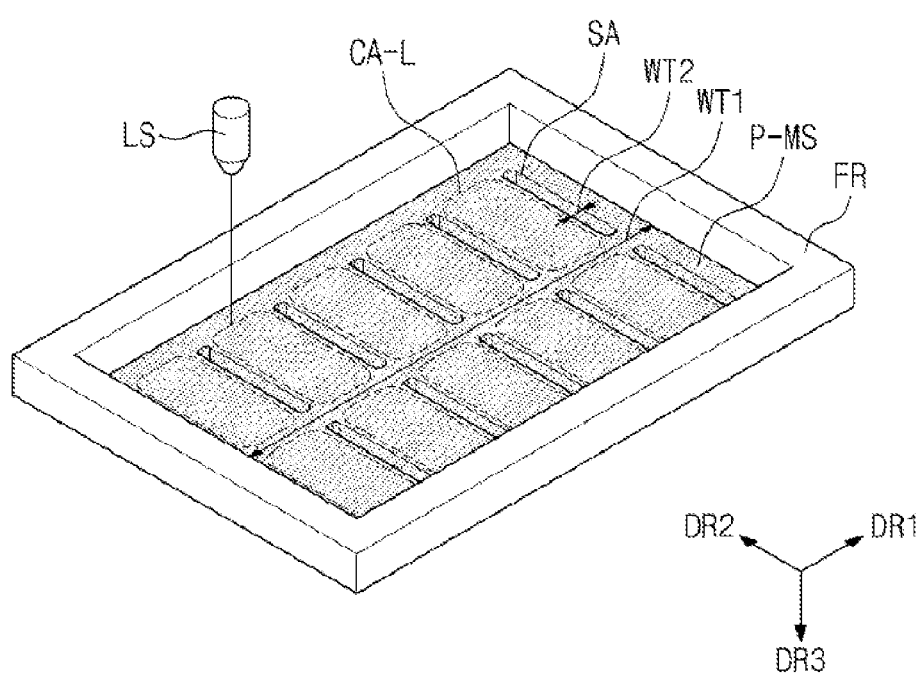
Figure 6C:
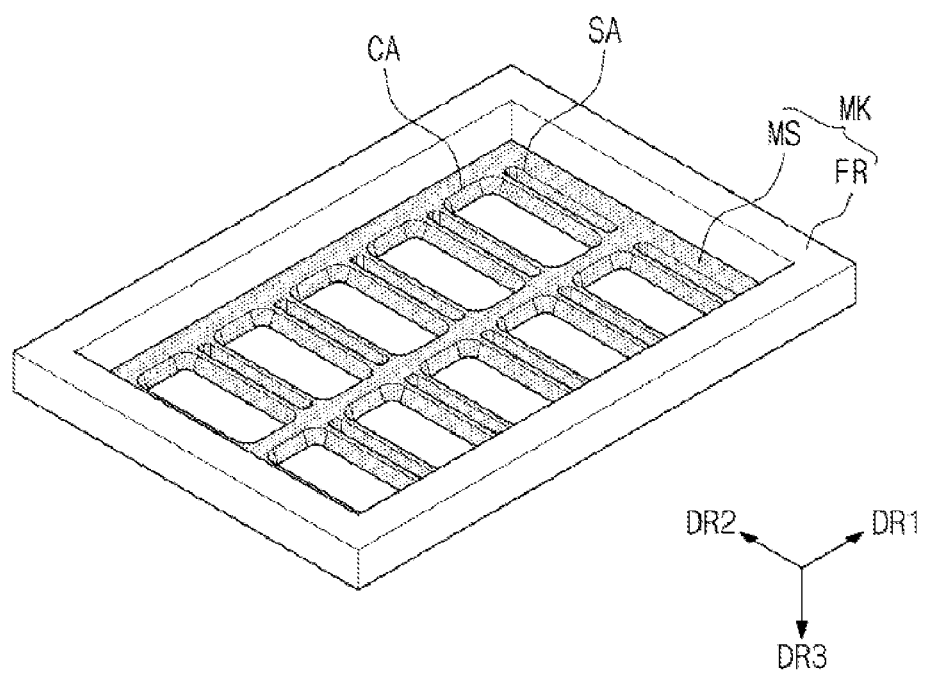

FIG. 5 is a flowchart showing a mask manufacturing method according to some embodiments of the present disclosure. FIGS. 6A to 6C are views showing a mask manufacturing method according to some embodiments of the present disclosure, and illustrate the mask manufacturing method according to the flowchart of FIG. 5.

Referring to FIG. 5, the mask manufacturing method may include stretching a preliminary mask sheet, and welding the preliminary mask sheet to a frame (S510). A repeated description that is the same as that of FIG. 2 will be omitted.

The mask manufacturing method according to some embodiments may include forming a plurality of slit openings in the preliminary mask sheet (S520). The plurality of slit openings may reduce a tensile force applied to the preliminary mask sheet. Accordingly, deformation of cell openings, which are to be formed subsequently, which may otherwise occur during the formation of the cell openings, may be reduced or prevented.

The mask manufacturing method according to some embodiments may include forming a plurality of cell openings that are respectively adjacent to the plurality of slit openings (S530). The plurality of cell openings may be formed adjacent to the slit openings, respectively. The cell openings are formed adjacent to the slit openings, respectively, and thus, the degree of deformation of the cell openings may be reduced during the formation thereof.

FIGS. 6A to 6C are views sequentially showing the mask manufacturing method of FIG. 5. Referring to FIGS. 6A to 6C, the mask manufacturing method according to some embodiments corresponding to FIG. 5 will be described in detail.

FIG. 6A shows forming slit openings in a preliminary mask sheet P-MS. FIG. 6B shows forming cell openings that are adjacent to the slit openings, respectively, in the preliminary mask sheet P-MS. FIG. 6C shows a state in which a mask including the plurality of slit openings and the cell openings is formed.

In FIGS. 6A to 6C, a plurality of slit openings SA, which are apart from each other, may be arranged in a first direction DR1. In the drawing, the twelve slit openings SA are illustrated such that six slit openings SA are arranged in the first direction DR1 in each of two columns that are arranged in a second direction DR2. However, the present disclosure is not limited thereto, and the number of slit openings SA may be diversely determined. The slit openings SA may be formed by emitting a laser beam LS to preliminary slit openings (P-SA). However, the present disclosure is not limited thereto, and they may be formed through various methods, such as an etching process. Cell openings CA may be formed between the slit openings SA. The slit openings SA and the cell openings CA may be formed alternately in the first direction DR1. The cell openings CA may be formed by emitting the laser beam LS onto positions CA-L where the cell openings are to be formed between the slit openings SA. The laser beams LS may be emitted from a side that is closer to a frame FR than to a preliminary mask sheet P-MS in a third direction DR3.

The number of slit openings SA may be greater than the number of the cell openings CA. The drawing illustrates the ten slit openings SA and the ten cell openings CA, but the present disclosure is not limited thereto. The size of each of the slit openings SA may be less than the size of each of the cell openings CA. For example, a width WT2 of the slit opening SA in the first direction DR1 may be less than a width of the cell opening CA. The number of slit openings SA and the width or size of the slit openings SA may affect a deformation amount of the cell openings CA when formed.

Generally, when V is the deformation amount of cell openings CA, the deformation amount may be expressed as $V=(F*L)/(E*A)$. Here, F may be a tensile force applied to the preliminary mask sheet P-MS, E may be elastic modulus, L may be a length WT1 of the preliminary mask sheet P-MS in the first direction DR1, and A may be an area of the cross-section of the preliminary mask sheet P-MS in the first direction DR1.

In some embodiments of the present disclosure, when "a" is a width WT2 of each of the slit openings SA in the first direction DR1 and "x" is the number of the slit openings SA, a deformation amount V of the cell openings CA formed adjacent to the slit openings SA according to some embodiments of the present disclosure may be expressed as V'=(F*(L−xa))/(E*A). That is, as the number x of the slit openings SA increases and the width a of the slit openings SA in the first direction DR1 increases, the deformation amount of the cell openings CA may be reduced.

In some embodiments, the forming of the cell openings CA may include forming preliminary cell openings between the plurality of slit openings SA. That is, as in the embodiments of FIGS. 2 to 4E, the preliminary cell openings are formed between the plurality of slit openings SA, and then the cell openings CA respectively corresponding to the preliminary cell openings may be formed. The preliminary cell openings, together with the slit openings SA, may reduce the deformation amount of the cell openings CA during the formation thereof. Unlike the slit openings SA, the preliminary cell openings may be removed while the cell openings CA are formed.

Also, the mask manufacturing method may further include locating an electrostatic chuck on the preliminary mask sheet P-MS fixed to the frame FR prior to forming the slit openings SA. The electrostatic chuck may reduce the deformation amount of the cell openings CA. The detailed description for the electrostatic chuck will be made with reference to FIGS. 8A to 8D.

Shielding members SM may be respectively located on the slit openings SA of a mask MK according to some embodiments of the present disclosure. The shielding members SM shield the slit openings SA against a deposition source during a deposition process. The shielding members SM may include the same metal as the mask sheet. That is, the shielding members SM may include an alloy of iron (Fe) and nickel (Ni).

Figure 7:
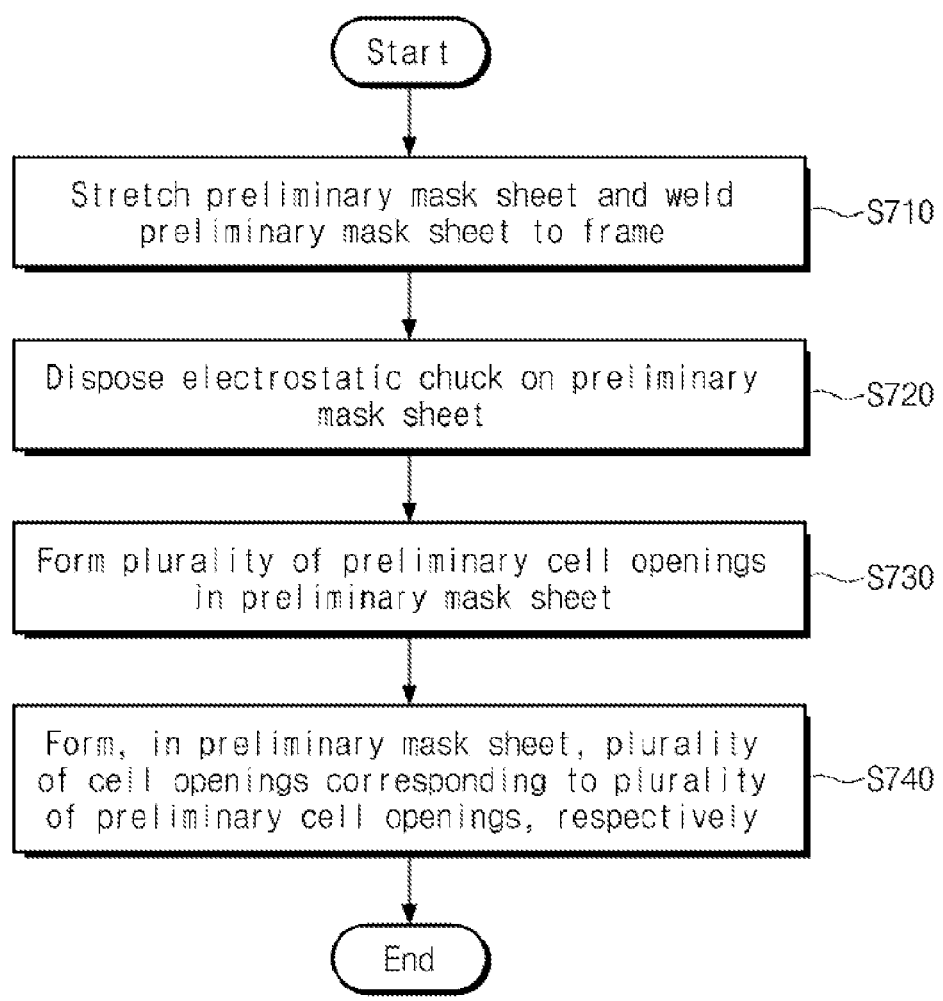
FIG. 7 is a flowchart showing a mask manufacturing method according to some embodiments of the present disclosure.

FIG. 7 is a flowchart showing a mask manufacturing method according to some embodiments of the present disclosure. FIGS. 8A to 8D are views showing a mask manufacturing method according to some embodiments of the present disclosure, and illustrate the mask manufacturing method according to the flowchart of FIG. 7.

In FIG. 7, the mask manufacturing method according to some embodiments may include stretching a preliminary mask sheet and welding and fixing the preliminary mask sheet to a frame (S710). The mask manufacturing method according to some embodiments may include locating an electrostatic chuck on the preliminary mask sheet (S720). The electrostatic chuck may have a role in preventing a change in tensile force of the preliminary mask sheet that is in a stretched state and that is fixed to the frame.

The mask manufacturing method according to some embodiments may include forming a plurality of preliminary cell openings in the preliminary mask sheet (S730). Thus, a duplicate description thereof will be omitted.

The mask manufacturing method according to some embodiments may include forming a plurality of cell openings that respectively correspond to the plurality of preliminary cell openings (S740). When the plurality of cell openings are provided to form a mask sheet, the electrostatic chuck may be removed from the mask sheet.

FIGS. 8A to 8D are cross-sectional views sequentially showing the mask manufacturing method of FIG. 7. Referring to FIGS. 8A to 8D, the mask manufacturing method according to some embodiments of FIG. 7 will be described in detail.

Figure 8A:
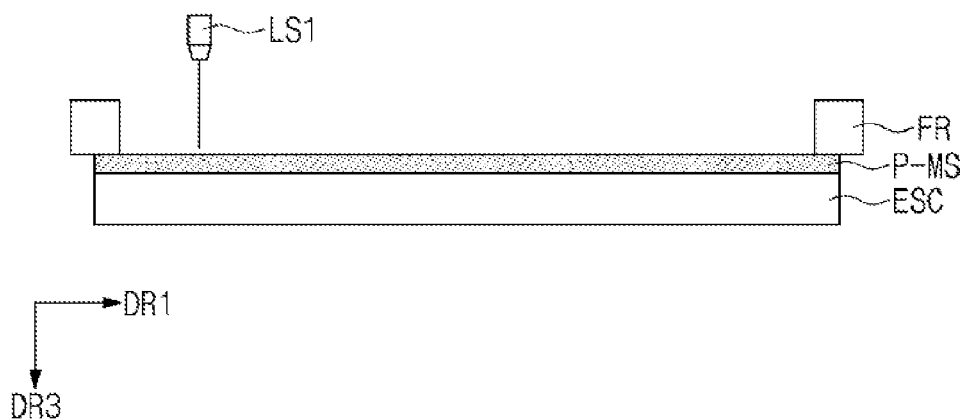
FIGS. 8A to 8D are views showing a mask manufacturing method according to some embodiments of the present disclosure.
Figure 8B:
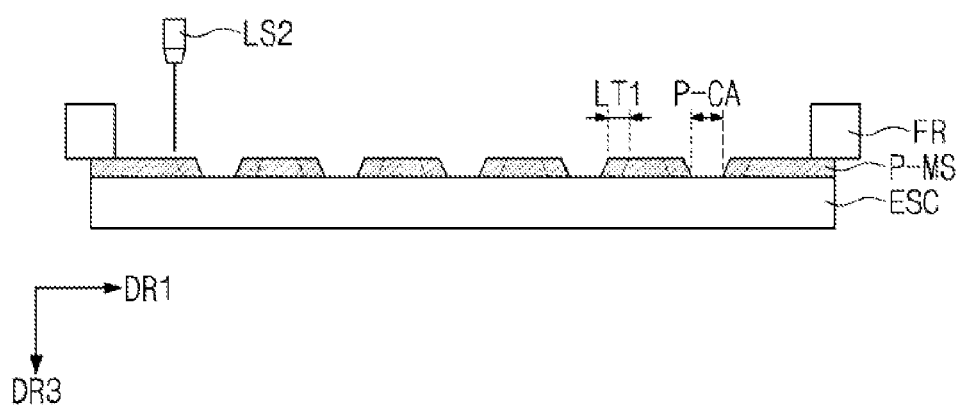
Figure 8C:
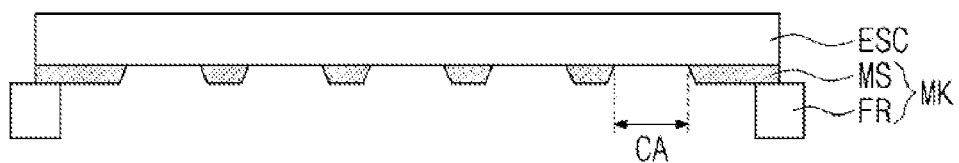
Figure 8C:
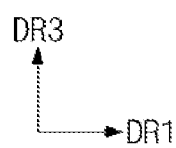

FIG. 8A illustrates a state in which an electrostatic chuck ESC is located on a preliminary mask sheet P-MS fixed to a frame FR. In FIG. 8A, a laser beam LS1 is emitted onto the preliminary mask sheet P-MS in a state in which the electrostatic chuck ESC is located, and consequently, preliminary cell openings P-CA may be formed, as shown in FIG. 8B. Cell openings CA may be formed to correspond to the preliminary cell openings P-CA, respectively. The cell openings CA may be formed by emitting a laser beam LS2 to the periphery of the preliminary cell openings P-CA. The electrostatic chuck ESC may reduce a deformation amount of the cell openings CA due to a tensile force during the formation thereof. An electrostatic force generated in the electrostatic chuck ESC may reduce the tensile force applied to both the preliminary cell openings P-CA and the cell openings CA, and may decrease the deformation amount thereof.

A difference LT1 between a width of each of the cell openings CA in a first direction DR1 and a width of each of the preliminary cell openings P-CA in the first direction DR1 may be about 100 μm or more. When the cell openings CA are formed, the electrostatic chuck ESC may be removed.

Figure 8D:
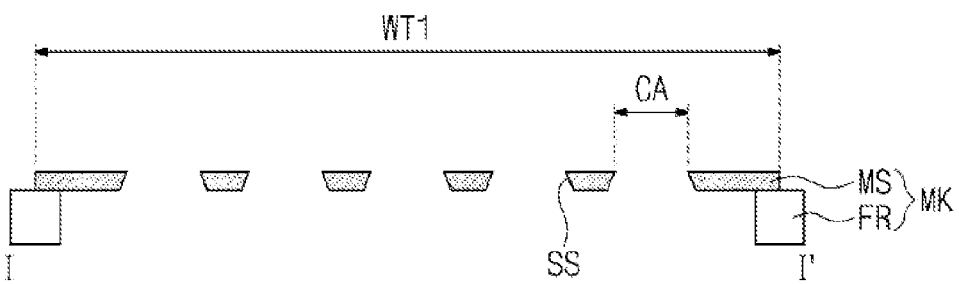
Figure 8D:
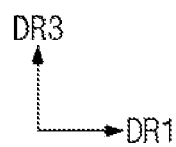
Figure 9:
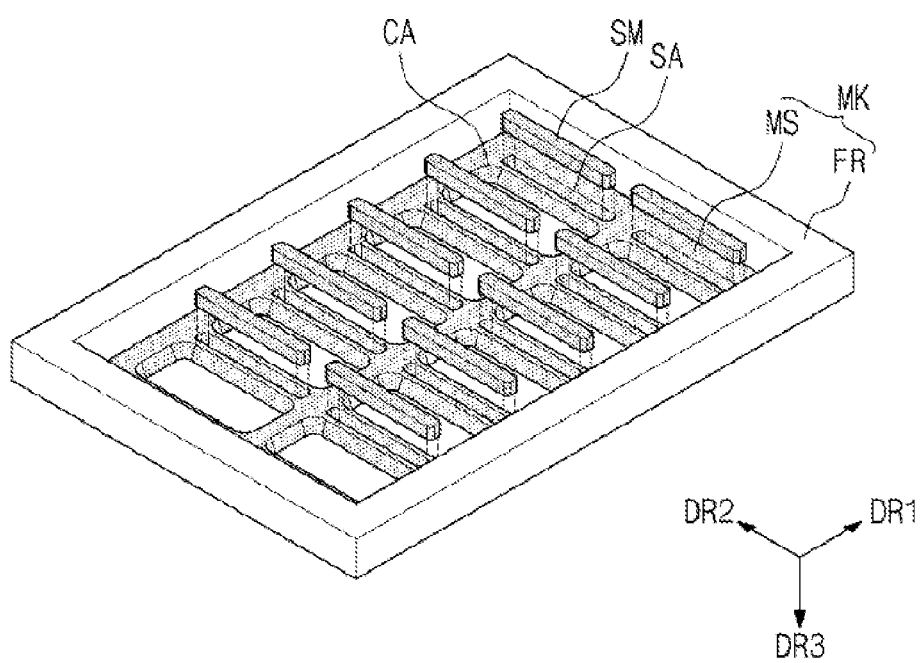
FIG. 9 is a view showing a mask manufacturing method according to some embodiments of the present disclosure.

FIG. 8D is a cross-sectional view taken along the line I-I' of FIG. 1. Referring to FIGS. 8A to 8D, in some embodiments of the present disclosure, inner surfaces SS of the mask sheet MS, which define the cell openings CA, may have a tapered shape. The tapered shape, which is formed by emitting the laser beam LS2, may help a deposition material to be efficiently deposited on a substrate. Accordingly, the shadow phenomenon may be reduced, and the area of a dead space of the substrate may decrease. In other embodiments, the inner surfaces SS of the mask sheet MS, which define the cell openings CA, have the tapered shape, and the inner surfaces defining the slit openings SA (see FIG. 6C) may have a shape that is different from that of the inner surfaces SS of the mask sheet MS that define the cell openings CA. That is, in some embodiments, the inner surfaces of the mask sheet, which define the slit openings SA, may have a tapered shape or not.

The embodiments of the present disclosure may improve the machining precision, and may reduce the shadow by performing stretching and welding processes first, and by then performing a machining process.

The mask manufactured by the mask manufacturing method according to some embodiments of the present disclosure may improve the precision of the cell positions on the mask, and may reduce or prevent occurrence of a shadow during the deposition process. The display panel formed by using the mask according to some embodiments of the present disclosure may have reduced dead space, and may be prevented from being defective.

The embodiments have been described in the drawings and the specification. While specific terms were used, they were not used to limit the meaning or the scope of the present disclosure described in the claims but merely used to explain some embodiments of the present disclosure. Accordingly, those skilled in the art will understand that various modifications and other equivalent embodiments are also possible. Hence, the real protective scope of the present disclosure shall be determined by the technical scope of the accompanying the claims, with functional equivalents thereof to be include therein.

What is claimed is:

1. A mask comprising:
   a frame; and
   a mask sheet that is located on the frame, and in which cell openings, and slit openings respectively between corresponding ones of the cell openings, are defined,
   wherein a width of each of the slit openings is less than a width of each of the cell openings, and
   wherein the cell openings and the slit openings are repeatedly and alternately arranged.

2. The mask of claim 1, further comprising shielding members that are respectively located on the slit openings to shield the slit openings.

3. The mask of claim 2, wherein the shielding members comprises a same material as the mask sheet.

* * * * *